United States Patent
Schwartz et al.

(10) Patent No.: US 11,119,177 B2
(45) Date of Patent: Sep. 14, 2021

(54) METHOD AND DEVICE FOR THE HYPERPOLARIZATION OF A MATERIAL SAMPLE

(71) Applicant: NVision Imaging Technolgies GmbH, Ulm (DE)

(72) Inventors: Ilai Schwartz, Ulm (DE); Martin Plenio, Ulm (DE); Qiong Chen, Neu-Ulm (DE); Zhenyu Wang, Neu-Ulm (DE)

(73) Assignee: NVision Imaging Technolgies GmbH, Ulm (DE)

( * ) Notice: Subject to any disclaimer, the term of this patent is extended or adjusted under 35 U.S.C. 154(b) by 0 days.

(21) Appl. No.: 16/474,147

(22) PCT Filed: Dec. 21, 2017

(86) PCT No.: PCT/EP2017/084229
§ 371 (c)(1),
(2) Date: Jun. 27, 2019

(87) PCT Pub. No.: WO2018/122124
PCT Pub. Date: Jul. 5, 2018

(65) Prior Publication Data
US 2019/0346527 A1    Nov. 14, 2019

(30) Foreign Application Priority Data
Dec. 29, 2016 (DE) .......................... 102016015567.1

(51) Int. Cl.
*G01R 33/58* (2006.01)
*G01N 24/12* (2006.01)
(Continued)

(52) U.S. Cl.
CPC ........... *G01R 33/586* (2013.01); *G01N 24/12* (2013.01); *G01R 33/323* (2013.01); *G01R 33/62* (2013.01)

(58) Field of Classification Search
CPC .... G01R 33/323; G01R 33/586; G01R 33/62; G01N 24/12
See application file for complete search history.

(56) References Cited

U.S. PATENT DOCUMENTS

| | | | |
|---|---|---|---|
| 2003/0121279 A1* | 7/2003 | Kalechofsky | A61K 49/1815 62/601 |
| 2008/0061781 A1* | 3/2008 | Servin | G01R 33/4633 324/311 |

(Continued)

OTHER PUBLICATIONS

International Search Report and Written Opinion in International Application No. PCT/EP2017/084229, dated Apr. 13, 2018.

(Continued)

*Primary Examiner* — Gregory H Curran
(74) *Attorney, Agent, or Firm* — Harris Beach PLLC; Laura W. Smalley (57) ABSTRACT

The invention relates to a method for the hyperpolarization of a material sample (4), which hits a number of first spin moments (10) of a first spin moment type, wherein the number of first spin moments (10) is brought into interaction with a second spin moment (16) of a second spin moment type, wherein the first spin moments (10) are nuclear spin moments and the second spin moment (16) is an election spin moment, wherein the first and second spin moments (10, 16) are exposed to a homogeneous magnetic field (B), wherein the second spin moment (16) is polarized along the magnetic field (B), wherein the second spin moment (16) is coherently manipulated by means of a, preferably repeated, sequence (S) having a number of successive high-frequency pulses ($P_{ki}$, $P_{k'i}$) temporally offset to each by durations ($T_{ki}$, (Continued)

$T_{k'i}$, T), in such a way that a polarization transfer from the second spin moment (16) to the first spin moments (10) occurs, and wherein durations ($T_{ki}$, $T_{k'i}$, T) inversely proportional to a Lamor frequency ($\omega_{Larmor}$) of the first spin moments (10) in the magnetic field (B) are inserted between high-frequency pulses ($P_{ki}$, $P_{k'i}$).

17 Claims, 7 Drawing Sheets (51) Int. Cl.
G01R 33/32 (2006.01)
G01R 33/62 (2006.01)

(56) References Cited

U.S. PATENT DOCUMENTS

| 2015/0064113 A1 | 3/2015 | Warren |
| 2016/0061914 A1 | 3/2016 | Jelezko et al. |
| 2017/0153218 A1* | 6/2017 | Chekmenev ......... G01N 33/287 |

OTHER PUBLICATIONS

Egor A. Nasibulov et al., "Theory of the Overhauser effect in the pulsed mode of EPR pumping: exploiting the advantages of coherent electron spin motion," Physical Chemistry Chemical Physics., vol. 14, No. 18, 2012, p. 6459, CP055462190, GB, ISSN: 1463-9076, DOI: 10.1039/c2cp23896a the whole document.

S.E. Korchak et al., "Low-Field, Time-Resolved Dynamic Nuclear Polarization with Field Cycling and High-Resolution NMR Detecytion," Applied Magnetic Reasonance. vol. 37, No. 1-4, Nov. 15, 2009 (Nov. 15, 2009), pp. 515-537, XP055462191, AU, ISSN: 0937-9347, DOI: 0.1007/s00723-009-0060-0 chapter 2; figure 1.

Alecci M. et al., "Low Field (10mT) Pulsed Dynamic Nuclear Polarization," Journal of Magnetic Reasona, Academic Press, Orlando, FL, US, vol. 138, No. 2, Jun. 1999 (Jun. 1999), pp. 313-319, CP00407288, ISSN: 1090-7807, DOI: 10.1006/JMRE.1999.1721 the whole document.

Un S. et al., Pulsed dynamic nuclear polarization at 5T, Chemical Physics Letters, vol. 189, No. 1, Jan. 24, 1992 (Jan. 24, 1992), pp. 54-59, XP055462196, Vienna, DOI: 10.1016/0009-2614(92)85152-z figure 1.

* cited by examiner

METHOD AND DEVICE FOR THE HYPERPOLARIZATION OF A MATERIAL SAMPLE

CROSS-REFERENCE TO RELATED APPLICATIONS

This application is the U.S. national phase entry under 35 U.S.C. § 371 from PCT International Application No. PCT/EP2017/084229, filed Dec. 21, 2017, which claims the benefit of priority of German Patent Application No. 102016015567.1, filed Dec. 29, 2016. The content of each of these applications is incorporated herein by reference in its entirety.

The invention relates to a method and an apparatus for hyperpolarizing a material sample, which has a number of polarizable spin moments, in particular nuclear spin moments.

If spin moments are situated in a magnetic field, energy differences between different spin states that depend on the orientation or alignment of the spin moments with respect to the magnetic field (Zeman effect) arise on account of magnetic interactions. As a rule, these energy differences cause polarization, i.e., differences in the occupation numbers of the individual alignments. Below, polarization of a number of spin moments should be understood to mean, in particular, the ratio of the difference between two occupied alignments, for example the difference between the number of spin moments oriented parallel and antiparallel to a magnetic field, and the overall number of spin moments.

Hyperpolarization, meaning the production of an ordered alignment of (nuclear) spin moments in a material sample far beyond the thermal equilibrium distribution (equilibrium magnetization), is one of the most important methods for increasing the resolution and/or sensitivity in the case of a magnetic resonance analysis, in particular in the case of an NMR (nuclear magnetic resonance) analysis or NMR examination. Typically, only the spin moments aligned along a magnetic field (net alignment, spin polarization) contribute to a measurement signal in the magnetic resonance analysis, and so a substantial improvement in the analysis is caused by increasing the number of aligned (polarized) spin moments. In this case, hyperpolarization facilitates an improved determination of the molecular and/or chemical composition of a material sample, for example in biological and/or medical applications and examinations. Moreover, hyperpolarization of the material sample facilitates shortened measurement times and the use of low magnetic field strengths.

In order to hyperpolarize a material sample, it is possible, for example, to make the nuclear spin moments of the material sample to be analyzed interact with electron spin moments. The electron spin moments have an interaction energy with the magnetic field that is approximately one thousand times stronger, and so, in thermal equilibrium, a comparatively higher number of electron spin moments with an ordered alignment or polarization sets-in in comparison with nuclear spin moments. Expressed differently, under otherwise identical conditions, the electron spin moments have a higher polarization or a higher degree of polarization (polarization component) than the nuclear spin moments.

The (thermal) polarization of the electron spin moments is transferred to the nuclear spin moments interacting therewith within the scope of a dynamic nuclear polarization (DNP). This means that the nuclear spin moments have an ordered alignment along the magnetic field after such a polarization transfer, said ordered alignment substantially corresponding to the equilibrium distribution of the electron spin moments before the dynamic nuclear polarization. Expressed differently, the nuclear spin moments have a (polarization) distribution that is substantially greater than the thermal equilibrium distribution of the nuclear spin moments.

As a rule, such DNP methods use a continuous wave (CW) radiofrequency irradiation of the electron spin moments, for example during a polarization transfer by means of the nuclear Overhauser effect (NOE), or a pulsed radiofrequency irradiation of the electron spin moments by means of a (pulse) sequence with a number of successive radiofrequency pulses. In comparison with CW DNP methods, pulsed DNP methods in this case typically have a more effective polarization transfer and reduced requirements on the strength of the magnetic field. By way of example NOVEL (nuclear spin orientation via electron spin locking) is a typical pulsed DNP method.

Pulsed DNP methods use pulsed radiofrequency irradiation instead of continuous wave radiofrequency irradiation; however, the polarization transfer between the spin moments—like in CW DNP—still only occurs during the time period in which the radiofrequency pulse is active. Expressed differently, the polarization transfer, as a rule, is only implemented when the electron spin moments are irradiated by a radiofrequency pulse.

In the case of a pulsed DNP method, the frequency and amplitude of the radiofrequency pulses are typically set in such a way for the purposes of an effective polarization transfer that the radiofrequency pulse satisfies the so-called Hartmann-Hahn condition. As a result, the electron spin moments and the nuclear spin moments have the same energy spacings of the respective (spin) energy levels in a rotating frame of reference. As a consequence, flip-flop processes of the electron spin moments with the nuclear spin moments, and consequently polarization transfer or polarization exchange therebetween, are facilitated during the irradiation by the radiofrequency pulse. Therefore, an effective polarization transfer requires the radiofrequency irradiation during the radiofrequency pulse to satisfy the Hartmann-Hahn condition as accurately as possible. As a result, comparatively stringent requirements in respect of accuracy and stability of the amplitude and/or the phase angle and the frequency of the radiofrequency pulses arise. Subsequently, this is expressed in disadvantageous fashion in terms of the robustness and the costs for carrying out such a method.

As a rule, pulsed DNP methods have a comparatively low flexibility. In particular, the polarization transfer realized by the DNP method has comparatively little robustness or stability. This means that the effectiveness of the polarization transfer is substantially or completely reduced in the case of a deviation of the frequency (detuning) or a deviation of the amplitude of the radiofrequency pulses from the Hartmann-Hahn condition. By way of example, such deviations occur on account of inhomogeneities in the magnetic field, signal fluctuations in radiofrequency components or generators, or on account of physical restrictions such as the spectral line width of the electron spin moments. Particularly in the case of low magnetic field strengths and large distances between the electron spin moments and the nuclear spin moments, the spectral width of the Hartmann-Hahn condition becomes comparatively narrow, as a result of which a reliable polarization transfer is made substantially more difficult.

In Taminiau, T. H., et al., "Universal control and error correction in multi-qubits in registers in diamond" (Nature Nanotechnology 9.3, 2014, 171-176), a pulsed sequence with a number of radiofrequency pulses is described, by means of which a so-called SWAP quantum gate is implemented for coherent exchange of two quantum states between an electron spin moment and a nuclear spin moment. Here, the temporal spacing of the radiofrequency pulses is proportional to an interaction strength between the electron spin moment and the nuclear spin moment, and consequently orders of magnitude longer than a period of the Larmor precession of the nuclear spins. Here, it is possible, under certain conditions, to bring about a polarization transfer between the spin moments by means of such SWAP quantum gates.

Disadvantageously, the known sequence and the necessary conditions for implementing the SWAP quantum gate are not suitable or applicable for a hyperpolarization of a spin ensemble, i.e. a multiplicity of spin moments. Thus, for example, an accurate determination of the interaction strength between the selected nuclear spin moment and the electron spin moment for implementing the SWAP quantum gate for a hyperpolarization of spin ensembles is not possible since a multiplicity of electron spin moments couple to a multiplicity of surrounding (randomly arranged) nuclear spin moments, in each case with unknown interaction strengths, in the process.

Even in the case of a theoretical scenario, in which all relevant interaction strengths between the spin moments are known and are constant, and in which a polarization transfer time to the complete polarization transfer is defined as the inverse of the respective interaction strength (in units of frequency), the known sequences from Taminiau, T. H., et al. would only cause a polarization transfer after more than half of the respective polarization transfer time has elapsed. As a result, the effectiveness of the polarization transfer of the known sequences would be substantially completely or at least partly reduced by disturbances during shorter durations of time, such as, e.g., a decoherence of the electron spin moment or a molecular movement (diffusion) of the target nuclear spin moment in liquid material samples.

Consequently, it is desirable for sequences that are intended to be suitable for the hyperpolarization of material samples to bring about polarization transfer dynamics that are substantially independent of the respective interaction strength between the electron and nuclear spin moments. Moreover, it is desirable for these dynamics to be brought about on a timescale that is significantly faster than the polarization transfer time determined by the respective interaction strength. Preferably, the polarization transfer in this case occurs on a timescale that is comparable to the Larmor period of the nuclear spin moments in the magnetic field.

US 2015/0064113 A1 has disclosed a method for hyperpolarizing a precursor molecule as a magnetic contrast agent for an NMR analysis. Here, the precursor molecule has spin moments of two different nuclear spin species. According to the method, the precursor molecule is hyperpolarized and a polarization of spin moments of the one nuclear spin species is subsequently transferred to spin moments of the other nuclear spin species by means of a sequence of one or more radiofrequency pulses.

US 2016/0061914 A1 has described a method for hyperpolarizing $^{13}C$ nuclear spin moments in a diamond, in which an electron spin moment of a color center is optically polarized and the polarization thereof is subsequently transferred to the $^{13}C$ nuclear spin moments. Here, the polarization transfer is brought about by means of a NOVEL sequence, in which the polarization transfer between the spin moments is only active during the time period of the radiofrequency pulse.

US 2008/0231281 A1 discloses a coil apparatus for a nuclear spin resonance system, comprising a resonator which, firstly, is tuned for operation at a $^{13}C$ Larmor frequency and, secondly, for operation at a $^{1}H$ Larmor frequency. During operation of the coil apparatus, a $^{1}H$ nuclear spin polarization is produced and transferred to $^{13}C$ nuclear spin moments by means of the nuclear Overhauser effect.

The invention is based on the object of specifying a particularly suitable method for hyperpolarizing a material sample. Furthermore, the invention is based on the object of specifying an apparatus for carrying out the method.

In respect of the method, the object is achieved, according to the invention, by the features of claim 1 and, in respect of the apparatus, the object is achieved, according to the invention, by the features of claim 14. Advantageous configurations and developments are the subject matter of the respective dependent claims.

The method according to the invention is suitable and configured for hyperpolarizing a material sample, which has a number of first spin moments of a first spin moment species, in particular nuclear spin moments. This means that the method can be used to increase the polarization or the ordered alignment of the first spin moments in the material sample beyond the thermal equilibrium distribution (equilibrium magnetization).

To this end, the number of first spin moments is brought into interaction with a second spin moment of a second spin moment species, in particular an electron spin moment. Here, in particular, the first and second spin moments only couple weakly with one another, meaning that the strength of the interactions between the second spin moment and the first spin moment is comparatively low and, in particular, less than the Larmor frequency of the spin moments. In particular, the individual strengths of the interactions between the first and second spin moments are substantially unknown. Expressed differently, the second spin moment is preferably in interaction with a spin ensemble of first spin moments.

Subsequently, the first and second spin moments are exposed to a homogeneous magnetic field. Expressed differently, a magnet, e.g. a superconducting magnet, is activated for the purposes of producing the magnetic field. In the process, the second spin moment is polarized along the magnetic field or the magnetic field direction. By way of example, if the second spin moment is part of a molecule or a solid body, it is conceivable here that, in the polarized state, the alignment or orientation of the second spin moment deviates from the orientation of the (external) magnetic field on account of internal fields. What is essential is that the effect of the magnetic field brings about a net alignment or polarization of the second spin moment, or the spin states thereof, independently of the actual orientation in space.

Subsequently, the second spin moment is coherently manipulated by means of a (pulse) sequence with a number of successive radiofrequency pulses, time-shifted in relation to one another by durations of time (pulse spacing, repetition time, evolution time), in such a way that there is a polarization transfer from the second spin moment to the first spin moments. As a result, a pulsed DNP method that is particularly simple to implement is realized. In particular, such a pulsed method facilitates a particularly flexible design of the sequence since a number of different polarization schemes are realizable in a simple manner by a variation in the sequence of radiofrequency pulses.

The same durations of time can also be used between the radiofrequency pulses of the sequence. As a result, the structure of the sequence is simplified. Here, the time durations are inversely proportional to the Larmor frequency of the first spin moments in the magnetic field. Expressed differently, the radiofrequency pulses are produced substantially periodically and equidistantly during the sequence.

Here, the sequence is preferably repeated, with the second spin moment expediently being polarized anew along the magnetic field prior to each sequence. As a result of the action or irradiation on the second spin moment by the sequence, the alignment or the polarization of the second spin moment is transferred to an interacting first spin moment, and so increasingly more first spin moments are polarized by the repetition. Additionally, or alternatively, it is conceivable, for example, that a plurality of second spin moments are used and simultaneously irradiated by the sequence such that, when the sequence is carried out, a plurality of first spin moments are polarized substantially simultaneously. As a result, the ordered alignment of the first spin moments is substantially increased in relation to the thermal polarization of the first spin moments (equilibrium magnetization) in the homogeneous magnetic field due to the application of the method.

Here, the invention proceeds from the discovery that the action of a (resonant) radiofrequency pulse changes the spin state of the second spin moment, wherein the in particular dipolar interaction between the first and second spin moments consequently brings about a different influence on the spin dynamics of the second spin moment in the durations of time before and after the radiofrequency pulse. Here spin dynamics should be understood to mean, in particular, the free movement (evolution) of the second spin moment i.e., without the action of a radiofrequency pulse under the action of the magnetic field and the interaction with the first spin moments. To this end, the polarized second spin moment is suitably brought into a superposition state by means of an initialization radiofrequency pulse with a 90° flip angle at the start of the sequence. The following pulses now control the phase and the amplitude of the interaction between the spin moments, which occurs between the pulses. Consequently, the polarization transfer substantially does not occur during the action of the radiofrequency radiation, but it occurs on account of the spin dynamics during the durations of time or pulse pauses (pulse spacing) between two adjacent radiofrequency pulses. In particular, the polarization transfer is facilitated by the sum or stringing together of the individual spin dynamics during the durations of time. In particular, this means that the pulse duration and pulse amplitude of the radiofrequency pulses are substantially independent of the Hartmann-Hahn condition. Consequently, the radiofrequency pulses are preferably able to act on a shorter timescale than the interaction strength between the first and second spin moments, and so the spin dynamics are reliably controllable.

Expressed differently, the polarization transfer according to the invention does not occur during a radiofrequency pulse but, in particular, at the end of the entire (pulse) sequence as a result of the constructive addition of the individual spin dynamics to polarizing overall spin dynamics of the second spin moment, in contrast to the prior art. This means that the second spin moment is substantially moved by the sequence in such a way that, on account of the spin dynamics influenced by the interaction with the first spin moments, a flip-flop process (polarization exchange) between the second spin moment and the first spin moment is facilitated. Expressed differently, the net effect of the entire evolution at the end of the sequence is a flip-flop process between a first and the second spin moment.

Consequently, the method according to the invention renders it possible to bring about a polarization transfer independently of the Hartmann-Hahn condition. As a result, the flexibility and robustness of the method is improved over conventional pulsed DNP methods. In particular, the polarization transfer is brought about by the evolution between the radiofrequency pulses, i.e., by the pulse spacing. The pulse spacing between the radiofrequency pulses is controllable in a comparatively simple manner, and so the technical requirements for carrying out the hyperpolarization are further reduced in comparison with the prior art.

Moreover, the method according to the invention facilitates a polarization transfer from the second spin moment to a (spin) ensemble of first spin moments, wherein the strength of the interactions between the second spin moment and the individual first spin moments is substantially unknown.

Since the radiofrequency pulses only act briefly or in sections on the second spin moment, the requirements in respect of stability and accuracy of the pulse amplitude and/or pulse frequency are advantageously reduced. As a result, it is possible to use radiofrequency pulses with a particularly high pulse amplitude and/or short pulse duration. This is particularly advantageous if fluctuations of the magnetic field (magnetic field strength, magnetic field direction) occur and/or if the second spin moment has a comparatively large spectral line width, for example on account of hyperfine interactions or a non-isotropic g tensor.

Preferably, (atomic) nuclear spin moments are used as first spin moments and an electron spin moment is used as a second spin moment. What is essential is that the first and second spin moments have different gyromagnetic ratios, meaning that they have a different Larmor frequency in the magnetic field. As a result, the second spin moment is manipulable in coherent or resonant fashion by means of the radiofrequency pulses, without the first spin moments being influenced in the process by the radiofrequency irradiation. Expressed differently, the second spin moment is manipulable independently of the first spin moments.

In this embodiment, the radiofrequency irradiation or the radiofrequency pulses are alternating electromagnetic fields with a frequency approximately equal to the Larmor frequency of the second spin moments (electron spin moments) in the magnetic field, in particular. Here, the frequency lies in the microwave range, for example, i.e., in the megahertz to gigahertz range. However, the radiofrequency pulses for manipulating the second spin moments preferably always have an amplitude whose Rabi frequency is higher than the Larmor frequency of the first spin moments in the magnetic field. In the case of a coherent and, in particular, resonant excitation of a spin moment using radiofrequency irradiation, the occupancy between the two resonant states oscillates with the so-called Rabi frequency. A higher amplitude of the radiofrequency irradiation results in a higher Rabi frequency.

In one possible embodiment, the first and second spin moments are part of a common molecule structure of a molecule or a common lattice structure of a solid as a material sample, for example for a magnetic resonance analysis embodied as a solid-state NMR analysis. An application in which, in particular, the second spin moment is part of a free monoradical or biradical molecule or of a metallic ion is likewise conceivable. Here, suitable molecules or ions are gadolinium ions ($Gd^{3+}$), TRITYL, TEMPO, BDPA, BTnE or TOTAPOL, for example.

In an advantageous embodiment, a sequence is produced to manipulate the second spin moment, the overall sequence duration of which, composed of the individual durations of time between the radiofrequency pulses, for bringing about the polarization transfer is shorter than a duration of time inversely proportional to the strength of an interaction between the spin moments (polarization transfer duration). Expressed differently, according to the method, the sequence brings about a polarization transfer between the first and second spin moments, the polarization dynamics of which occur on a timescale that is substantially shorter than a polarization transfer duration predetermined by the interaction strength between the spin moments. Preferably, the brought-about polarization dynamics act here on a timescale that is comparable to the Larmor period of the first spin moments in the magnetic field. In particular, this also means that, in contrast to NOVEL, the pulse duration of the radiofrequency pulses is substantially shorter than the polarization transfer duration. As a result, a particularly time-saving and effective method for hyperpolarization is ensured, said method, in particular, also being suitable and configured for hyperpolarization of spin ensembles having a multiplicity of interacting first and second spin moments.

In a suitable development, only a flip angle of 90° and/or 180° is used for each radiofrequency pulse of the sequence. As a result, a particularly simple and little-complex sequence is realized for the method.

In an advantageous configuration, the radiofrequency pulses are produced along two pulse axes that are oriented perpendicular to one another. As a result, pulse errors of the radiofrequency pulses, such as inaccuracies in the phase angle and/or amplitude and/or flip angle, for example, are able to be balanced out or compensated, and so a particularly stable and error-unsusceptible sequence is facilitated. Preferably, an X-pulse axis and a Y-pulse axis are used as pulse axes that are oriented perpendicular to one another.

Here, in particular, a pulse axis should be understood to mean a pulse direction in a rotating frame of reference, meaning a phase angle along which a radiofrequency pulse is exerted or acted on. Here, in particular, a radiofrequency pulse along an X-pulse axis is a radiofrequency pulse which has a phase angle of 0° in the rotating frame of reference. Accordingly, a radiofrequency pulse along a Y-pulse axis is, in particular, a radiofrequency pulse which has a (relative) phase angle of 90° in relation thereto in the rotating frame of reference. Here, the Z-pulse axis is always oriented substantially along the magnetic field. Expressed differently, the first radiofrequency pulse of the sequence substantially determines the (relative) phase angle and consequently the pulse direction of the subsequent radiofrequency pulses.

In a particularly stable configuration of the method, provision is made for a radiofrequency pulse of the sequence to be configured as a composite pulse. In this context, a composite pulse should be understood to mean a radiofrequency pulse that has been composed, in which a plurality of individual radiofrequency pulses are strung together substantially directly i.e., without a duration of time introduced therebetween along different pulse axes, and so an effective flip angle is implemented upon action of the composite pulse. As a result, pulse errors of the radiofrequency pulses are compensated better, as a result of which the polarization transfer is improved. In a possible configuration, a number or all radiofrequency pulses of the sequence, for example, are configured as composite pulses.

Additionally, or as an alternative thereto, it is conceivable here, for example, for the (enveloping) pulse form of a radiofrequency or composite pulse to be varied or adapted. This means that the pulse form is rectangular, Gaussian or sinc-shaped, for example. In a particularly suitable configuration, the pulse form is configured in view of an optimal control of the second spin moment, in particular, and so a particularly effective and reliable manipulation of the second spin moment is ensured. By way of example, numerical methods are used here for the purposes of optimizing the pulse form.

An additional or further aspect of the invention provides for the second spin moment to be optically polarized for polarization or alignment along the magnetic field. Here, an optical polarization should be understood to mean an alignment or arrangement of the spin moment during an illumination or irradiation with (laser) light in an optically visible or else invisible wavelength range.

To this end, the second spin moment is suitably embedded in a system matrix, such as a molecule or solid, for example, as a result of which an energy level structure is formed for the second spin moment, said energy level structure producing a preferred polarization of the spin moment along the magnetic field in the case of optical irradiation.

Expressed differently, the spin moment is prepared in a certain (spin) state by the optical irradiation. As a result, it is possible to carry out the method more quickly and to repeat the latter since only an optical light pulse is required for aligning the second spin moment on the magnetic field. Consequently, it is not necessary, in particular, to let the longitudinal relaxation time (Ti time) of the second spin moment elapse when repeating the sequence.

In a possible configuration, an electron spin moment of a color center of a solid sample is used as a second spin moment. Here, a color center should be understood to mean a point or lattice defect in the solid lattice of the solid sample, said defect absorbing optically visible light. Preferably, the second spin moment of the color center is optically polarizable in the process. The first spin moments of the material sample are suitably brought into interaction with the second spin moment of the solid sample by virtue of the samples being brought into contact with one another. By way of example, the solid sample is a nanoparticle, which is added to a liquid material sample as a suspension.

In this context, a suitable color center is the nitrogen vacancy center (NV center) in diamond or a nanodiamond, for example. By way of example, silicon oxide vacancies and silicon vacancies (SiV centers) in silicon carbide are also conceivable. Alternatively, oxide vacancies in zinc oxide, for example, are possible color centers with an optically polarizable electron spin moment.

In an alternative embodiment, an electron spin moment of a photoexcitable triplet state molecule is used as second spin moment. By way of example, such molecules are tetraphenylprophyrin, $H_2$TTP or ZnTTP in nonpolar solvents such as mineral oil or benzene, or pentacene and anthracene in solutions with benzene or paradichlorobenzene.

An additional or further aspect of the invention provides for a sequence portion to be produced during the sequence, said sequence portion comprising at least one sequence unit. Here, for the purposes of bringing about the polarization transfer by means of the overall dynamics of the sequence, it is conceivable, for example, for the sequence to be composed of individual nested or successively implemented sequence portions or sequence units, which are each repeatable a number of times, for example.

Here, the sequence unit has a sequence unit duration which is an odd multiple of half a Larmor period of the first spin moments in the magnetic field. Additionally, or alternatively, provision is made for the radiofrequency pulses of successive sequence units to have a relative time shift in relation to one another. Here, a sequence unit duration should be understood to mean, in particular, the overall duration of time (pulse durations and time intervals) of the respective sequence unit.

Here, one or more radiofrequency pulses are provided during a transition from a first sequence unit to a subsequent second sequence unit, said one or more radiofrequency pulses being used to rotate an alignment of the second spin moment that is oriented parallel to the magnetic field into a plane that is oriented perpendicular to the magnetic field. In one possible embodiment, the radiofrequency pulse or pulses are arranged at the end of the respective sequence unit or, alternatively, they are embodied as intermediate pulses introduced between the sequence units, meaning that the individual sequence units are separated from one another by means of one or more intermediate pulses.

In a conceivable development, it is conceivable, for example, for the radiofrequency pulse or pulses to bring about a flip angle, different from 180° in terms of action, of the second spin moment during the transition between the sequence portions. This ensures that a magnetization along the Z-axis of the second spin moment is rotated into a non-parallel orientation in relation to the Z-axis. This is important for the polarization dynamics to be brought about. Here, the radiofrequency pulse or pulses preferably realize a flip angle of the second spin moment which rotates the second spin moment in an XY-plane, i.e., a transversely oriented plane, perpendicular to the magnetic field. Preferably, the phase of the first spin moments is additionally phase offset by 90°, in particular, on account of their Larmor precession in the magnetic field between the sequence units. By way of example, this is realizable by means of an additional time shift between the radiofrequency pulses of the involved sequence units, said time shift having a duration of time equal to an odd multiple of half the Larmor period of the first spin moments. It is likewise conceivable for such a time or phase offset to be brought about by virtue of the sequence unit durations of the individual sequence units equaling an odd multiple of half the Larmor period of the first spin moments in the magnetic field.

In a possible embodiment of the method, a sequence portion is produced during the sequence, during which sequence portion four radiofrequency pulses, each with a 90° flip angle, follow one another with a shift in relation to one another with the same durations of time. This facilitates a particularly simple and quick polarization transfer. Here, the sequence portion is composed of four identical sequence units, for example, wherein each sequence unit substantially comprises one duration of time and one radiofrequency pulse with a 90° flip angle.

In a conceivable configuration, a sequence portion is produced during the sequence, during which sequence portion a number of radiofrequency pulses, each with a 180° flip angle, follow one another with a shift in relation to one another with the same durations of time, wherein the radiofrequency pulses are alternately embodied as composite pulses. By way of example, radiofrequency pulses along an X-pulse axis and composite pulses along a composite pulse axis are produced alternately in the process. As a result, a particularly flexible sequence is realizable, transferring itself advantageously onto the effectiveness of the polarization transfer. Here, the sequence portion suitably comprises a number of successive sequence units, which are each composed of a radiofrequency pulse with a 180° flip angle about the X-pulse axis and a composite pulse about the composite pulse axis, and the associated durations of time.

In a suitable development, a first sequence portion and a radiofrequency pulse with a 90° flip angle (intermediate pulse) and a second sequence portion are produced successively during the sequence. During the sequence portions, a number of radiofrequency pulses, each with a 180° flip angle, are produced following one another with a shift in relation to one another with the same durations of time in each case. Here, the durations of time of the second sequence portion have a relative time shift in relation to the durations of time of the first sequence portion. Here, the radiofrequency pulses are suitably produced in alternating or changing fashion for example, in the style of an XY-decoupling sequence along the X-pulse axis and the Y-pulse axis during the sequence portions, as a result of which the stability and reliability of the polarization transfer brought about thereby is improved. It is likewise conceivable for the sequence portions to be configured in the form of other decoupling sequences, such as a CPMG (Carr-Purcell-Meiboom-Gill) sequence or KDD (Knill dynamical decoupling) sequence, for example.

Here, the first sequence portion has a substantially symmetric construction in respect of the durations of time and the radiofrequency pulses, with the second sequence portion having a non-symmetric construction in relation thereto as a result of the time shift. Here, in particular, the time shift is introduced between the radiofrequency pulse with a 90° flip angle between the sequence portions and the first radiofrequency pulse of the second sequence portion. Expressed differently, the duration of time between the radiofrequency pulse between the sequence portions and the first radiofrequency pulse of the second sequence portion has a duration of time that is longer by the time shift than the duration of time between the last radiofrequency pulse of the first sequence portion and the radiofrequency pulse between the sequence portions.

In an advantageous embodiment, a first sequence portion and a second sequence portion are produced immediately successively during the sequence. This means that the first radiofrequency pulse of the second sequence portion immediately follows the last radiofrequency pulse of the first sequence portion. Expressed differently, no duration of time is provided between the two sequence portions. Two radiofrequency pulses with a 90° flip angle are produced during the sequence portions, a radiofrequency pulse with a 180° flip angle being arranged at the midpoint therebetween in each case. In the first sequence portion, the radiofrequency pulses with a 90° flip angle are produced along a first pulse axis and the radiofrequency pulse with a 180° flip angle is produced along a second pulse axis that is oriented perpendicular to the first pulse axis. In the subsequent second sequence portion, the radiofrequency pulses with a 90° flip angle are produced along the second pulse axis and the radiofrequency pulse with a 180° flip angle is produced along the negative first pulse axis. No additional initial or end pulses of the sequence are required in this embodiment.

In a suitable configuration, the sequence portion or portions are repeated multiple times in succession during the sequence. The overall time for a successful polarization transfer, i.e., the (overall) duration of all individual durations of time of the sequence, is suitably proportional to the strength of the interaction between the second spin moment and the first spin moments. Consequently, it is possible to flexibly adapt the overall time of the sequence to the required overall time for the polarization transfer by way of the repetitions of the sequence portions. As a result, a particularly effective method for hyperpolarization is ensured.

In a preferred application, the method is used in an apparatus for hyperpolarizing a material sample before and/or during a magnetic resonance analysis. By way of example, the apparatus is an NMR spectrometer or an imaging NMR device. The component of the aligned first spin moments in the material sample is easily increasable by the method according to the invention, and so a greater number of first spin moments contribute to a measurement signal of the magnetic resonance analysis. As a result, the accuracy and resolution of the magnetic resonance analysis is improved in a cost-effective manner and with little outlay. Moreover, the costs for producing and/or operating the apparatus are advantageously reduced since the technical requirements in respect of stability and accuracy of the radiofrequency pulses and of the magnetic field are reduced by the application of the method according to the invention.

Exemplary embodiments of the invention are explained in more detail below on the basis of a drawing. In schematic and simplified illustrations.

Parts and variables corresponding to one another are always provided with the same reference signs in all figures.

Figure 1:
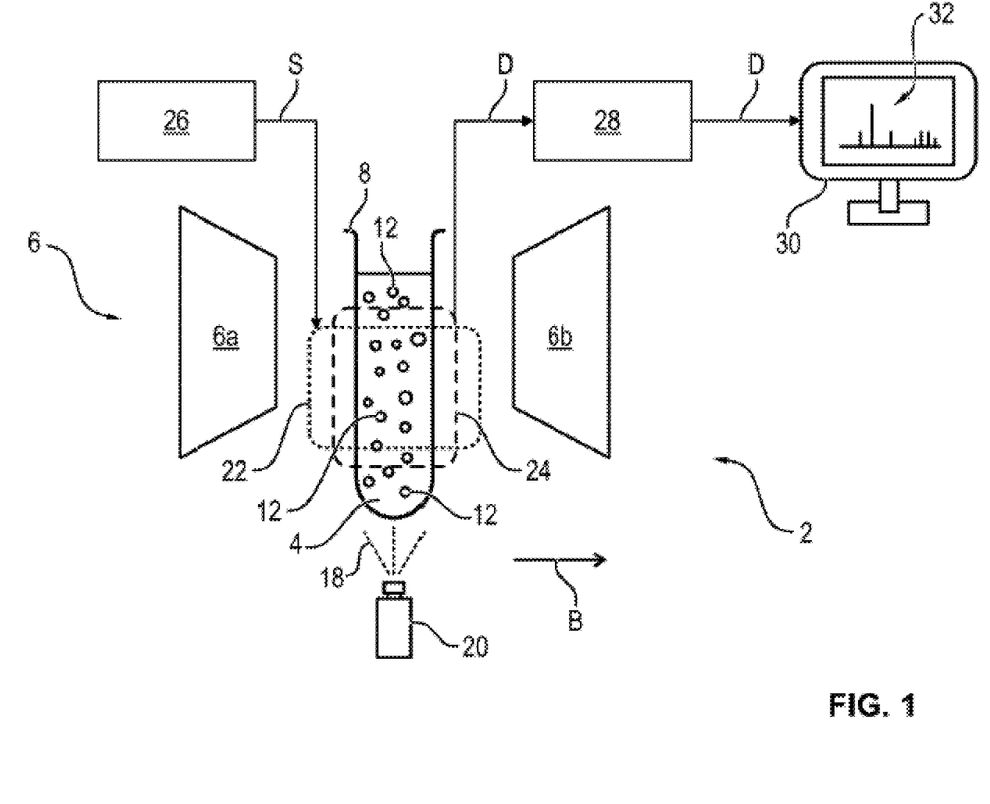
FIG. 1 shows an apparatus for hyperpolarizing a material sample for a nuclear magnetic resonance analysis.

The apparatus 2 illustrated in FIG. 1 is suitable and configured for hyperpolarizing a material sample 4. To this end, the apparatus 2 is configured, in particular, as an NMR spectrometer for a magnetic resonance or nuclear magnetic resonance analysis of the material sample 4. The apparatus 2 comprises an electromagnet and/or superconducting magnet 6, with a north pole 6*a* and a south pole 6*b*, between which a homogeneous magnetic field B is produced during operation. For the purposes of hyperpolarizing and/or analyzing the material sample 4, the latter is positioned in the region exposed between the north pole 6*a* and south pole 6*b*.

Figure 2:
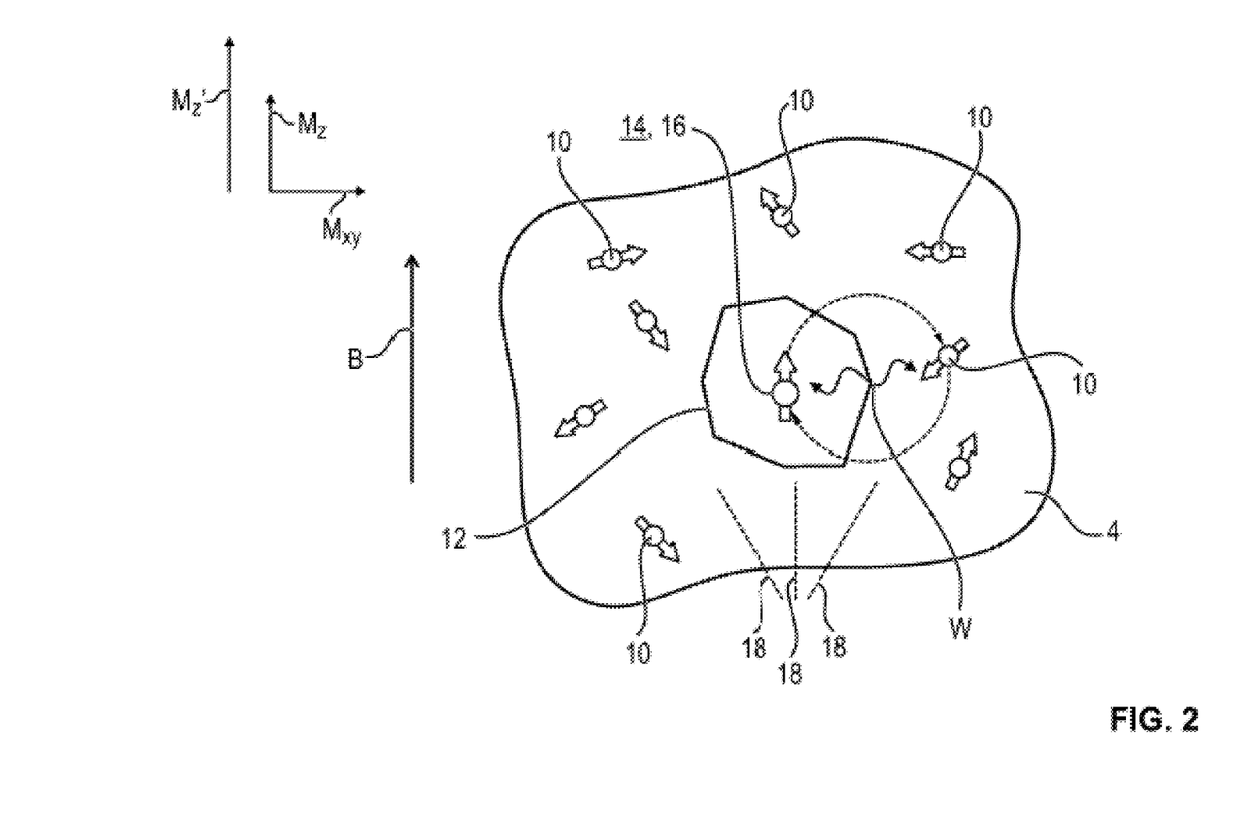
FIG. 2 shows the material sample in sections, with a number of nuclear spin moments and with a nanodiamond with an optically polarizable electron spin moment.

In this exemplary embodiment, the material sample 4 is configured, in exemplary fashion, as a liquid sample in a (nonmagnetic) sample container 8. As illustrated in a simplified and schematic manner in FIG. 2, the material sample 4 has a number of spin moments 10, in particular nuclear spin moments. In FIG. 2, the nuclear spin moments 10 are only provided in exemplary fashion with reference signs.

In this exemplary embodiment, a number of solid samples or nanoparticles 12, in particular nanodiamonds, have been added to the material sample 4 as a suspension, said solid samples or nanoparticles preferably each having at least one color center 14 with an optically polarizable spin moment 16, in particular an electron spin moment. In an exemplary manner, FIG. 2 only illustrates one nanodiamond 12 with one electron spin moment 16 of a color center 14. By way of example, the color center 14 is an NV center (nitrogen vacancy center), which is alignable along a polarization axis, which is oriented parallel to the magnetic field B in exemplary fashion in FIG. 2, by means of laser light 18 of a laser 20.

The material sample 4 and the sample container 8 are at least partly surrounded in the assembled state by an excitation coil 22, illustrated using dotted lines, and a detection coil (pickup coil) 24, illustrated using dashed lines. The excitation coil 22 is connected to a radiofrequency generator 26 and produces a (pulse) sequence S with a number of radiofrequency pulses (FIG. 3) of a certain frequency, pulse duration, pulse amplitude and pulse phase angle during operation.

The radiofrequency pulses are preferably resonant with the electron spin moments 16 of the nanodiamonds 12, meaning that the frequency of the radiofrequency pulses is matched to the Larmor frequency of the electron spin moments 16 in the magnetic field B. In particular, the nuclear spin moments 10 of the material sample 4 are substantially not influenced by the radiofrequency pulses of the sequence S. The radiofrequency pulses are alternating electromagnetic fields, which are oriented substantially transversely, meaning perpendicular, to the magnetic field B.

The pickup coil 24 is embodied to receive and detect the alternating magnetic field produced by the nuclear spin moments 10 during an NMR analysis. To this end, the pickup coil 24 is configured as a Faraday coil, for example, which transmits the detected NMR signal D via a receiver 28 to a display device 30 for the purposes of analyzing and displaying an NMR spectrum 32 of the nuclear spin moments 10 of the material sample 4. In an alternative configuration, the excitation coil 22 and the pickup coil 24 are embodied as a common coil, for example.

During the operation of the apparatus 2, the material sample 4 is positioned in the magnet 6. As a result of the magnetic field B, the nuclear spin moments 10 of the material sample 4 are at least partly aligned along the magnetic field B. Expressed differently, a thermal equilibrium distribution of the nuclear spin moments 10 sets in, with equilibrium magnetization $M_z$ of the nuclear spin moments 10, which is oriented parallel to the magnetic field B, forming.

Within the scope of the NMR analysis, the equilibrium magnetization $M_z$ is converted into a transversal magnetization $M_{xy}$, the precession of which in the magnetic field B induces the NMR signal D in the pickup coil 24. Therefore, the production of a transversal magnetization $M_{xy}$ that is as large as possible is desirable for the purposes of improving the NMR signal D. This requires an increase in the (longitudinal) equilibrium magnetization $M_z$ of the nuclear spin moments 10. To this end, the sequence S for hyperpolarizing the nuclear spin moments 10, meaning the production of an ordered alignment of the nuclear spin moments 10 in the material sample 4 far beyond the thermal equilibrium distribution, is carried out. Expressed differently, an increased magnetization $M_{z'}$ is produced by the action of the sequence S before and/or during the NMR analysis, said increased magnetization having a higher degree of polarization or polarization than the equilibrium magnetization $M_z$.

As a result of the sequence S, the polarization of the electron spin moments 16 of the attached nanoparticles 12 is transferred here to the nuclear spin moments 10. This polarization transfer is illustrated schematically in FIG. 2 using dashed lines. To this end, the electron spin moments 16 are initially optically polarized by means of the laser light 18 and are subsequently coherently manipulated by means of the sequence S radiated-in. As illustrated purely schematically in FIG. 2, the respective electron spin moment 16 is coupled to the nuclear spin moments 10 in the surroundings thereof by means of a dipolar interaction W.

Here, the polarization transfer of the electron spin moment 16 to the nuclear spin moment 10 is not implemented during radiofrequency pulse but, in particular, at the end of the sequence S on account of the total or collected spin dynamics caused thereby. Expressed differently, the electron spin moment 16 is substantially manipulated by means of the sequence S in such a way that a flip-flop process is facilitated on account of the interaction W with the nuclear spin moment 10. To this end, it is substantially necessary for the sequence S to produce an effective Hamiltonian $H_{eff}$, which brings about the required spin dynamics.

In particular, an effective Hamiltonian $H_{eff}$ of the form $$H_{eff} = -\frac{1}{\pi} A_x (I_x S_x + I_y S_y) = -\frac{A_x}{2\pi}(I_+ S_- + I_- S_+)$$

is required for the polarization transfer, where $A_x$ denotes the transversal interaction strength on account of the interaction W and π is pi. Here, the spin operators of the nuclear spin moment 10 are denoted by $I_x$, $I_y$, $I_+$ and $I_-$, with the spin operators of the electron spin moment 16 being described accordingly by $S_x$, $S_y$, $S_+$ and $S_-$. Here, the Hamiltonian $H_{eff}$ is specified in units of frequency (Hertz, Hz). Here, the polarization transfer occurs after a duration of time $\pi^2/A_x$, meaning that the sequence duration of the sequence S is preferably matched to this duration of time or the interaction strength $A_x$.

A general and schematic structure of the sequence S for producing such an effective Hamiltonian is explained in more detail below on the basis of the block diagram in FIG. 3. In the block diagrams of FIGS. 3 to 7, the radiofrequency pulses are illustrated as rectangles, which are arranged successively along a time axis not denoted in any more detail.

Figures 3, 4:
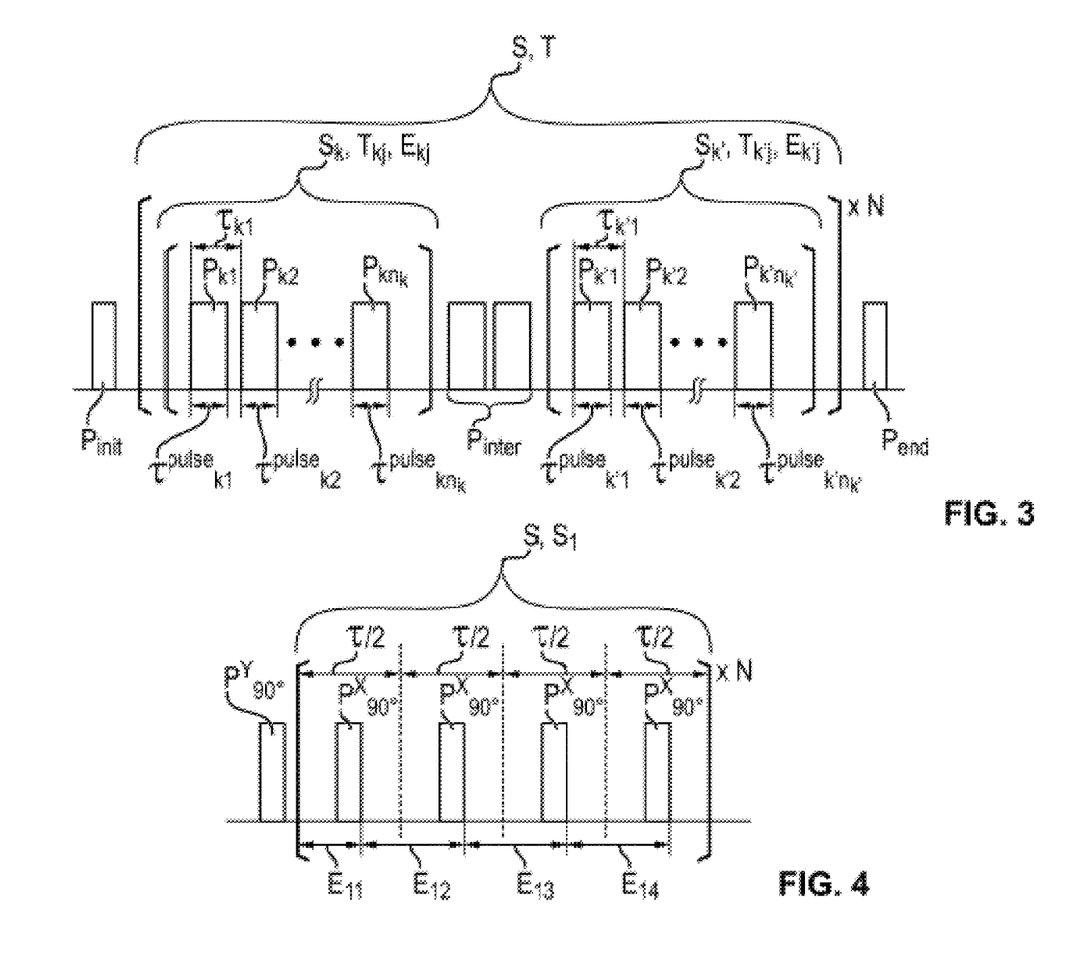
FIG. 3 shows a sequence of radiofrequency pulses for hyperpolarizing the material sample.
FIG. 4 shows a first exemplary embodiment of the sequence with a sequence portion with four successive radiofrequency pulses with 90° flip angles.

The (polarization) sequence S comprises a number of radiofrequency pulses which are able to be combined, for example, into a plurality of sequence portions—illustrated in exemplary fashion in FIG. 3 by means of two sequence portions $S_k$ and $S_{k'}$. The sequence portions $S_k$ and $S_{k'}$ are separated from one another by means of optional intermediate pulses $P_{inter}$, for example. The sequence S is enclosed by an optional initialization pulse $P_{init}$ and one or more optional end pulses $P_{end}$. Here, in particular, the initialization pulse $P_{init}$ is a radiofrequency pulse with a 90° flip angle, which produces a superposition state of the electron spin moment 16. By way of example, the sequence S is repeatable N-times between the initialization pulse $P_{init}$ and the optional end pulse $P_{end}$, as a result of which the polarization transfer realized thereby is extended.

Each sequence portion $S_k$, $S_{k'}$ comprises a number $n_k$ or $n_{k'}$ of radiofrequency pulses $P_{ki}$, $P_{k'i}$, which act on the electron spin moments 16 for a pulse duration $\tau^{pulse}_{ki}$, $\tau^{pulse}_{k'i}$ in each case. Here, the radiofrequency pulses $P_{ki}$, $P_{k'i}$ are time-shifted in relation to one another by a duration of time (pulse pause, evolution time, waiting time) $\tau_{ki}$, $\tau_{k'i}$ in each case. Here, the index i is a running index which runs from 1 to $n_k$ or $n_{k'}$. Here, it is possible for the individual sequence portions $S_k$ or $S_{k'}$ to be repeated a number of times in succession in each case during the sequence S.

The time durations $\tau_{ki}$, $\tau_{k'i}$ and pulse durations $\tau^{pulse}_{ki}$, $\tau^{pulse}_{k'i}$ of the sequence portions $S_k$, $S_{k'}$ in this case add up to an overall sequence duration T of the sequence S, which is preferably shorter than a polarization transfer duration that is proportional to the interaction W. Expressed differently, the overall sequence duration T required to bring about the polarization transfer is shorter than the polarization transfer duration.

Each sequence portion $S_k$, $S_{k'}$ has at least one sequence unit $E_{kj}$, $E_{k'j}$ with a respective sequence unit duration $T_{kj}$, $T_{k'j}$. Expressed differently, a sequence portion $S_k$, $S_{k'}$ is composed of one or more successive sequence units $E_{kj}$, $E_{k'j}$. The running index j in this case labels the sequence units $E_{kj}$, $E_{k'j}$ of the sequence portion $S_k$, $S_{k'}$. In FIG. 3, each sequence portion $S_k$, $S_{k'}$ is presented with only one sequence unit $E_{kj}$, $E_{k'j}$ in exemplary fashion.

The sequence S is configured in such a way that an effective Hamiltonian of the form $S_x I_x + S_y I_y$ is brought about. To this end, the individual sequence units $E_{kj}$, $E_{k'j}$ are suitably embodied in such a way that, during a respective sequence unit $E_{kj}$, $E_{k'j}$, an effective Hamiltonian of the form $S_x I_x$ or $S_y I_y$ is formed. This means that a plurality of sequence units $E_{kj}$, $E_{k'j}$ and/or a plurality of sequence portions $S_k$, $S_{k'}$ are required to bring about the desired polarization dynamics.

Therefore, for the polarization transfer, it is necessary to effectively interchange the spin operators $S_x$ and $S_y$ and the spin operators $I_x$ and $I_y$ in successive sequence units $E_{kj}$, $E_{k'j}$ of the sequence S.

Figure 5:
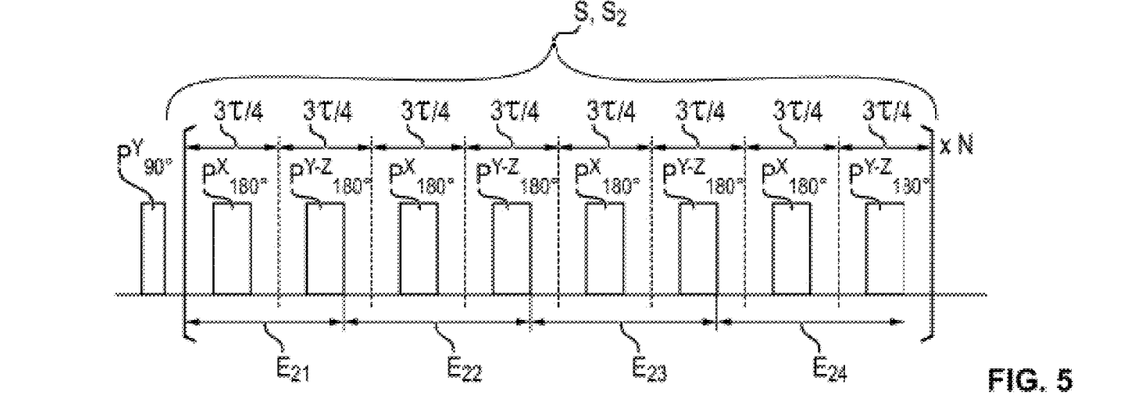
FIG. 5 shows a second exemplary embodiment of the sequence with a sequence portion with alternating radiofrequency pulses with 180° flip angles and YZ-composite pulses.

One or more radiofrequency pulses are provided between the sequence units $E_{kj}$, $E_{k'j}$ or at the end of a respective sequence unit $E_{kj}$, $E_{k'j}$ for the purposes of changing between the spin operators $S_x$ and $S_y$. Here, it is conceivable, for example, to carry out a single radiofrequency pulse with a 90° flip angle (FIG. 4, FIG. 7) or two different radiofrequency pulses with a 90° flip angle (FIG. 8) or one radiofrequency pulse with a 180° flip angle about a pulse axis $1/\sqrt{2}$ (X+Y) (FIG. 5). What is essential is that an alignment of the second spin moment 16 oriented parallel to the magnetic field B is rotated into a plane oriented perpendicular to the magnetic field B by the radiofrequency pulse or pulses.

Figure 7:
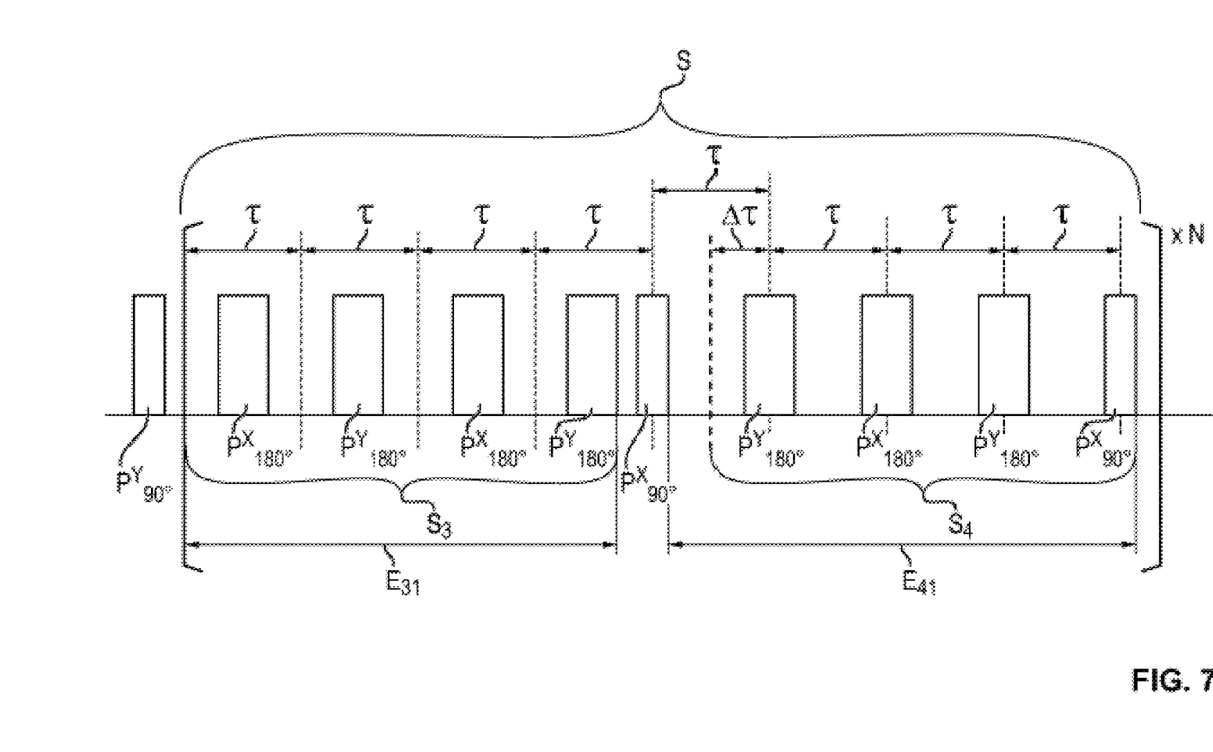
FIG. 7 shows a third exemplary embodiment of the sequence with a first sequence portion and with a radiofrequency pulse with a 90° flip angle and with a second sequence portion.
Figure 8:
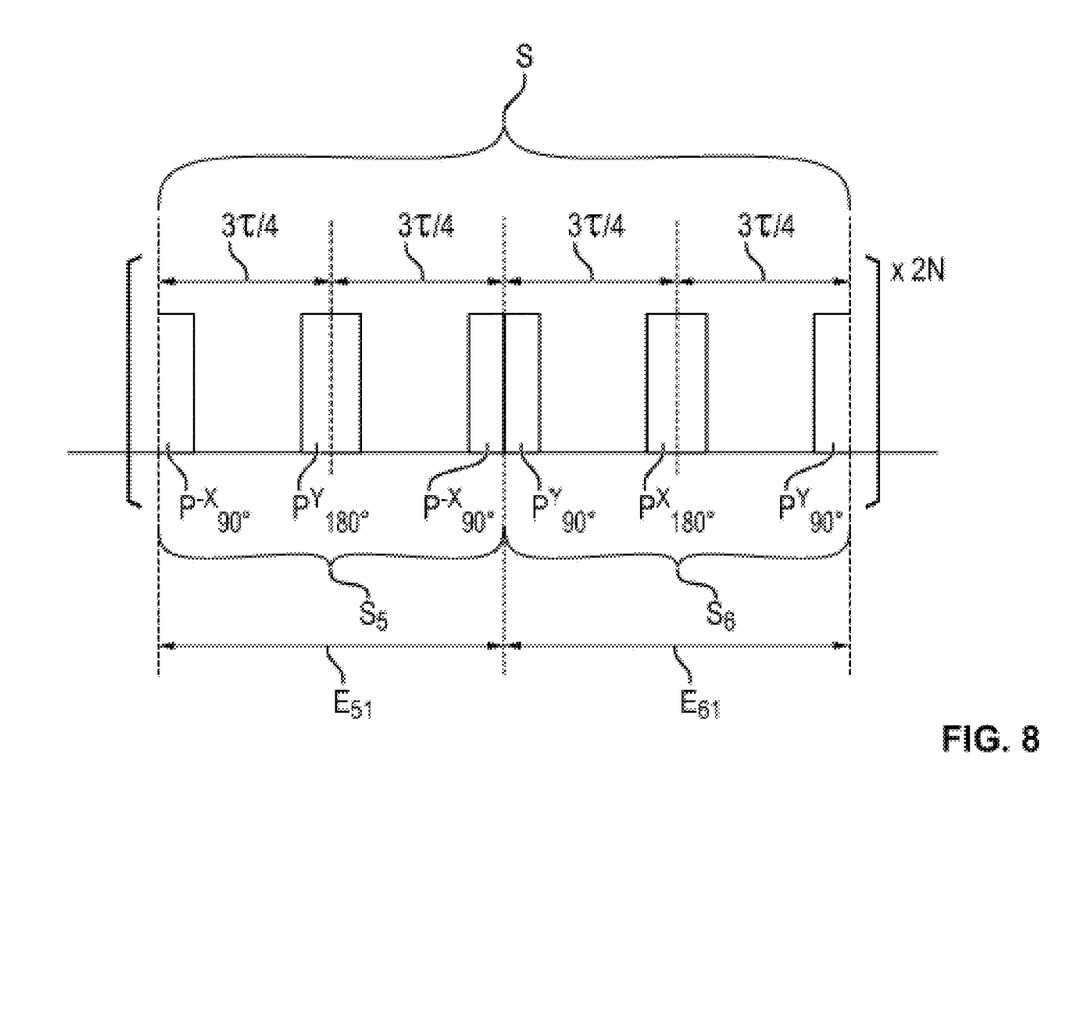
FIG. 8 shows a fourth exemplary embodiment of the sequence with two sequence portions, each with two radiofrequency pulses with a 90° flip angle and with a radiofrequency pulse with a 180° flip angle arranged therebetween.

The change between the spin operators $I_x$ and $I_y$ is preferably brought about by a relative phase shift between the spin operators $S_x$ and $S_y$. To this end, the sequence unit duration $T_{kj}$, $T_{k'j}$ is dimensioned to be an odd multiple of half a Larmor period ($\pi/2\omega_{Larmor}$) of the spin moments 10 in the magnetic field B (FIG. 4, FIG. 5, FIG. 8). Likewise, it is conceivable that, for example, the radiofrequency pulses $P_{ki}$, $P_{k'i}$ of successive sequence units $E_{kj}$, $E_{k'j}$ or sequence portions $S_k$, $S_{k'}$ have a relative time shift $\Delta\tau$ in relation to one another, wherein the time shift suitably equals an odd multiple of half the Larmor period of the spin moments 10 in the magnetic field (FIG. 7).

Below, exemplary embodiments of the sequence S are explained on the basis of FIGS. 4 to 7. Here, the radiofrequency pulses are denoted by $P^X_{90°}$, $P^Y_{90°}$, $P^X_{180°}$ or $P^Y_{180°}$, with the angle specification describing the flip angle and X and Y describing the pulse axis or phase angle of the radiofrequency pulse in a rotating frame of reference. Consequently, a $P^Y_{90°}$ radiofrequency pulse is, for example, a radiofrequency pulse with a pulse duration $\tau^{pulse}_{ki}$, $\tau^{pulse}_{k'i}$, which brings about a 90° flip angle of the electron spin moment 16 at a given pulse amplitude and which is produced with a (relative) 90° phase offset (Y).

In the exemplary embodiments of the sequences S, the durations of time $\tau_{ki}$, $\tau_{k'i}$ between the radiofrequency pulses are specified in units of half of the Larmor period of the nuclear spin moments 10, meaning by way of a time duration $\tau = M2\pi/2\omega_{Larmor}$, where $\omega_{Larmor}$ is the Larmor frequency of the nuclear spin moments 10 in the magnetic field B and m is an odd integer.

FIG. 4 illustrates a first exemplary embodiment of the sequence S. In this embodiment, the sequence S only comprises a sequence portion $S_1$ with four sequence units $E_{11}$, $E_{12}$, $E_{13}$ and $E_{14}$, which each have one radiofrequency pulse. Here, the initialization pulse $P^Y_{90°}$ is embodied as a radiofrequency pulse with a 90° flip angle, which is produced along a Y-pulse axis. Here, the radiofrequency pulses of the sequence units $E_{11}$, $E_{12}$, $E_{13}$ and $E_{14}$ are each embodied as a $P^X_{90°}$ pulse along an X-pulse axis and with a 90° flip angle. The radiofrequency pulses $P^X_{90°}$ of the sequence S or of the sequence portion $S_1$ are time-shifted in relation to one another, in each case with a duration of time of $\tau/2 = 2\pi/4\omega_{Larmor}$.

By way of the four successive sequence units $E_{11}$, $E_{12}$, $E_{13}$ and $E_{14}$, there effectively is a change between the spin operators $S_x$ and $S_y$ of the electron spin moment 16, and so an effective Hamiltonian $H_{eff}$ with the desired polarization dynamics is produced in a rotating frame of reference. In particular, four interaction terms are produced by the radiofrequency pulses $P^X_{90°}$ of the sequence units $E_{11}$, $E_{12}$, $E_{13}$ and $E_{14}$. In the duration of time before the first radiofrequency pulse $P^X_{90°}$, the interaction W is proportional to the product $S_x I_x$ of the spin operators $S_x$ and $I_x$.

Between the first and second radiofrequency pulse $P^X_{90°}$, the interaction W is proportional to the product $S_y I_x$ since the radiofrequency pulse $P^X_{90°}$ effectively changes the spin operator $S_x$ to the spin operator $S_y$. The interaction W is characterized by the product $-S_x I_x$ between the second and the third radiofrequency pulse $P^X_{90°}$, with the interaction W after the fourth $P^X_{90°}$ radiofrequency pulse accordingly being describable as $-S_y I_x$. As a result, the spin dynamics characterized by the effective Hamiltonian $H_{eff}$ for the polarization transfer is produced in a rotating frame of reference.

Below, a second exemplary embodiment of the sequence S is described on the basis of FIG. 5 and FIG. 6. In this configuration, the sequence S has a sequence portion $S_2$ with four radiofrequency pulses $P^X_{180°}$ and with four composite pulses $P^{Y-Z}_{180°}$, which act on the electron spin moment 16 alternately or in turn. Here, the radiofrequency pulses $P^X_{180°}$ and the composite pulses $P^{Y-Z}_{180°}$ are each time-shifted in relation to one another by the same durations of time $m\tau/4 = 6\pi/8\omega_{Larmor}$. In principle, it is possible here to use the duration of time $m\tau/4$, where m is an odd integer. Expressed differently, the time durations $T_{ki}$, $T_{k'i}$ between the pulses $P^X_{180°}$ and $P^{Y-Z}_{180°}$ are longer than in the sequence portion $S_1$ of the exemplary embodiment described above. Here, the sequence portion $S_2$ is composed of four similar sequence units $E_{21}$, $E_{22}$, $E_{23}$ and $E_{24}$, which each comprise a radiofrequency pulse $P^X_{180°}$ and a composite pulse $P^{Y-Z}_{180°}$.

Figure 6:
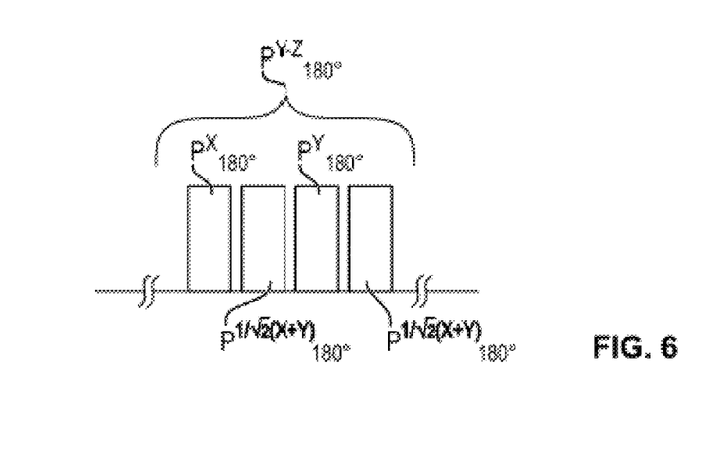
FIG. 6 shows the structure of a YZ-composite pulse.

FIG. 6 schematically shows the construction of a (Y-Z-)composite pulse $P^{Y-Z}_{180°}$. The composite pulse $P^{Y-Z}_{180°}$ comprises four directly successive radiofrequency pulses which, when composed, implement the 180° flip angle about a YZ-pulse axis. The first radiofrequency pulse $P^X_{180°}$ has a 180° flip angle about the X-pulse axis. The subsequent radiofrequency pulse $P^{1/\sqrt{2}(X+Y)}_{180°}$ implements a 180° flip angle about a pulse axis $1/\sqrt{2}(X+Y)$, which is arranged as a bisector between the X- and the Y-pulse axis. Expressed differently, the radiofrequency pulse $P^{1/\sqrt{2}(X+Y)}_{180°}$ in each case has a relative phase offset of 45° in relation to the X-pulse axis (0°) and the Y-pulse axis (90°). The third radiofrequency pulse $P^Y_{180°}$ implements a 180° flip angle about the Y-pulse axis, with the action of the fourth radiofrequency pulse $P^{1/\sqrt{2}(X+Y)}_{180°}$ bringing about a 180° flip angle about the bisecting pulse axis $1/\sqrt{2}(X+Y)$.

The exemplary embodiment of FIG. 7 shows a sequence S with two sequence portions $S_3$ and $S_4$, which are separated from one another by means of a radiofrequency pulse $P^X_{90°}$: (intermediate pulse). Here, the sequence portions $S_3$ and $S_4$ in each case only comprise one sequence unit $E_{31}$ and $E_{41}$, respectively.

Here, the sequence portion $S_3$ is preferably configured in the style of an XY decoupling sequence, in particular an XY4 decoupling sequence. This means that the sequence portion $S_3$ substantially comprises four radiofrequency pulses $P^X_{180°}$, $P^Y_{180°}$, $P^X_{180°}$ and $P^Y_{180°}$, which each have a 180° flip angle and which are produced alternately along the X-pulse axis and the Y-pulse axis. The four radiofrequency pulses $P^X_{180°}$, $P^Y_{180°}$, $P^X_{180°}$ and $P^Y_{180°}$ of the sequence portion $S_3$ are respectively time-shifted in relation to one another by a duration of time $\tau = 2\pi/2\omega_{Larmor}$.

In this exemplary embodiment, the sequence portion $S_4$ has four radiofrequency pulses $P^Y_{180°}$, $P^X_{180°}$, $P^Y_{180°}$ and $P^X_{90°}$, which are shifted in relation to one another by the duration of time t. Here, the sequence portion $S_4$ is embodied substantially mirror symmetric to the sequence portion $S_3$ in relation to the intermediate pulse $P^X_{90°}$, with the last radiofrequency pulse $P^X_{90°}$ of the sequence portion $S_3$ having a 90° flip angle. As is comparatively clearly visible in FIG. 7, the sequence portion $S_4$ additionally has a time shift $\Delta\tau$ in relation to the sequence portion $S_3$.

The intermediate pulse $P^X_{90°}$ between the sequence portions $S_3$ and $S_4$ has a 90° phase offset in relation to the initialization pulse $P^Y_{90°}$. The pulse axis or the phase angle of the intermediate pulse $P^X_{90°}$ in this case equals the phase angle of the last radiofrequency pulse $P^X_{90°}$ of the sequence portion $S_4$. The last radiofrequency pulse $P^Y_{180°}$ of the sequence portion $S_3$ has a pulse spacing of $\tau/2$ in relation to the intermediate pulse $P^X_{90°}$, with the pulse spacing between the intermediate pulse $P^X_{90°}$ and the first radiofrequency pulse $P^Y_{180°}$ of the sequence portion $S_4$ being substantially $\Delta\tau + \tau/2$ on account of the time shift $\Delta\tau$. Here, in particular, the time shift $\Delta\tau$ is $\Delta\tau = \tau/2$, and so the pulse spacing between the intermediate pulse $P^X_{90°}$ and the first radiofrequency pulse $P^Y_{180°}$ of the sequence portion $S_4$ equals the duration of time $\tau$.

Here, the sequence portion $S_3$ substantially produces spin dynamics that are proportional to a factor of $\cos(\omega t)S_x I_x$, where $\omega$ is the frequency of the radiofrequency radiation of the radiofrequency pulses. As a result of the time shift $\Delta\tau$, spin dynamics proportional to $\sin(\omega t)S_y I_x$ are produced accordingly during the sequence portion $S_4$. This produces the effective Hamiltonian $H_{eff}$ for the polarization transfer in a frame of reference rotating with the frequency $\omega$.

The sequence S in FIG. 7 facilitates the use of strong radiofrequency pulses, meaning the radiofrequency pulses preferably have a high pulse amplitude and a comparatively short pulse duration $\tau^{pulse}_{ki}$, $\tau^{pulse}_{k'i}$. A short pulse duration $\tau^{pulse}_{ki}$, $\tau^{pulse}_{k'i}$ should be understood to mean, in particular, a duration of time of the radiofrequency pulse that is comparatively short in relation to the associated duration of time $T_{ki}$, $T_{k'i}$. Preferably, the pulse duration $\tau^{pulse}_{ki}$, $\tau^{pulse}_{k'i}$ is shorter than $\tau_{ki}/5$ and $\tau_{k'i}/5$, respectively.

FIG. 8 shows a further exemplary embodiment of the sequence S with two sequence portions $S_5$ and $S_6$. The sequence portions $S_5$ and $S_6$ each have a sequence unit $E_{51}$ and $E_{61}$.

Here, the first sequence portion $S_5$ has three successive radiofrequency pulses $P^{-X}{}_{90°}$, $P^{Y}{}_{180°}$ and $P^{-X}{}_{90°}$, which are shifted in relation to one another by a duration of time $3\tau/4 = 6\pi/8\omega_{Larmor}$. By way of example, it is also possible here to use the duration of time $m\tau/4$, where m is an odd integer. The first and third radiofrequency pulse $P^{-X}{}_{90°}$ each have a 90° flip angle along the −X-pulse axis, meaning along the negative X-pulse axis. The second radiofrequency pulse $P^{Y}{}_{180°}$ included therebetween has a 180° flip angle along the Y-pulse axis.

The second sequence portion $S_6$ has a substantially identical construction to the first sequence portion $S_5$, with the pulse axes being modified in comparison with the first sequence portion $S_5$. Here, three successive radiofrequency pulses $P^{Y}{}_{90°}$ $P^{X}{}_{180°}$ and $P^{Y}{}_{90°}$ are produced in the second sequence portion $S_6$, which are shifted in relation to one another by a duration of time $3\tau/4 = 6\pi/8\omega_{Larmor}$. Consequently, the first and third radiofrequency pulse $P^{Y}{}_{90°}$ each have a 90° flip angle along the Y-pulse axis. Accordingly, the second radiofrequency pulse $P^{X}{}_{180°}$ included therein has a 180° flip angle along the X-pulse axis, meaning along the inverted pulse direction to the first and third radiofrequency pulses $P^{-X}{}_{90°}$ of the sequence portion $S_5$. Here, the first radiofrequency pulse $P^{Y}{}_{90°}$ of the sequence portion $S_6$ directly adjoins the third radiofrequency pulse $P^{-X}{}_{90°}$ of the sequence portion $S_5$ during the sequence S.

Advantageously, no additional initialization pulses $P_{init}$ and/or end pulses $P_{end}$ are necessary in this embodiment of the sequence S, as a result of which a particularly simple sequence S is realized. Moreover, the pulse spacings or the durations of time $3\tau/4$ are preferably dimensioned in such a way that the finite pulse duration $\tau^{pulse}{}_{ki}$, $\tau^{pulse}{}_{k'i}$ of the radiofrequency pulses $P^{-X}{}_{90°}$, $P^{Y}{}_{180°}$, $P^{Y}{}_{90°}$, $P^{X}{}_{180°}$ is taken into account. In this embodiment, the sequence S preferably has an even number 2N of repetitions in the case of a repetition.

Moreover, the sequence S in this configuration is particularly robust in relation to frequency detuning, meaning in relation to deviations of the frequency ω from the Larmor frequency of the electron spin moment 16 in the magnetic field B.

Furthermore, the sequence S has a high effectiveness in respect of the polarization transfer, even in the case of pulse errors, meaning a deviating phase angle or phase duration, of the radiofrequency pulses.

Figure 9A:
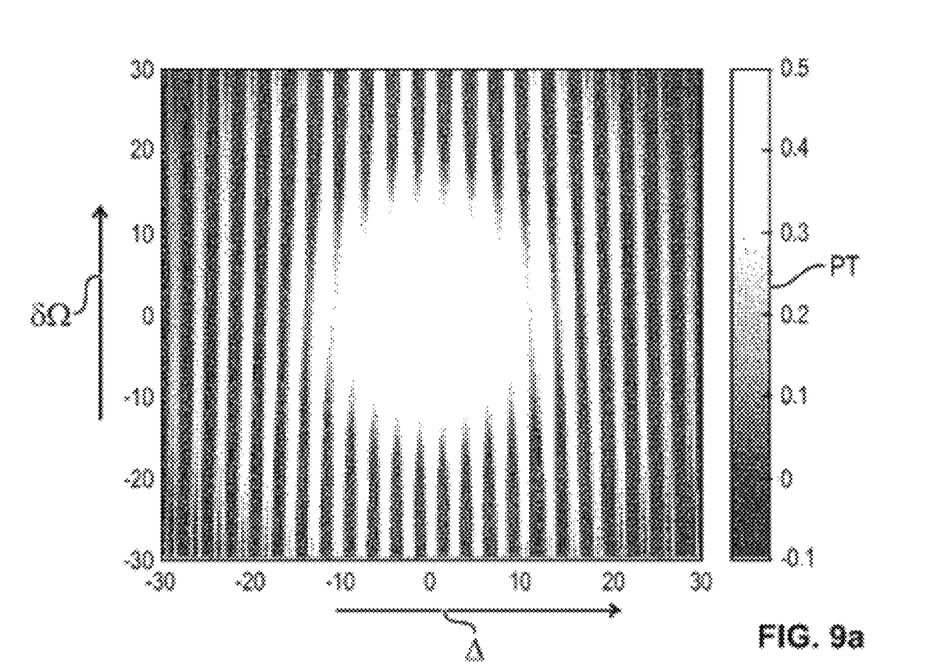
FIGS. 9*a* and 9*b* show a simulation of the robustness of the sequence according to FIG. 8.
Figure 9B:
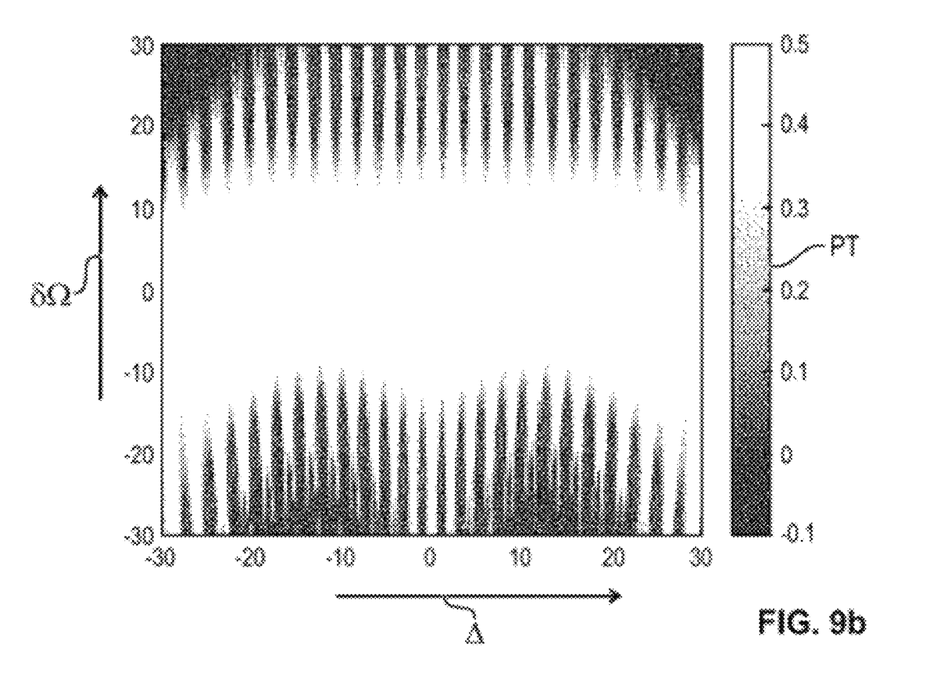

In FIGS. 9a and 9b, a two-dimensional representation of a simulation is shown in each case as an example for the improved stability and robustness of the sequence S according to FIG. 8. The simulations in FIGS. 9a and 9b relate to a system of five nuclear spin moments 10 and one electron spin moment 16, with the interaction strengths W having a Gaussian distribution.

Here, the simulations show the effect of pulse errors $\delta\Omega$ and (frequency) detuning $\Delta$ on the polarization transfer PT. The pulse error $\delta\Omega$ is plotted along the ordinate axis (y-axis) and the detuning $\Delta$ is plotted along the abscissa axis (x-axis), with the grayscale value representing the value of the respective polarization transfer PT. Here, the pulse error $\delta\Omega$ is defined as a percentage deviation of a pulse amplitude $\Omega$ from an error-free pulse amplitude $\Omega_0$. Here, detuning $\Delta$ is understood to mean a deviation of the frequency ω of the radiofrequency pulses from the Larmor frequency $\omega_e$ of the electron spin moment 16 in the magnetic field B, with the detuning $\Delta$ being plotted in units of megahertz (MHz). The polarization transfer PT is defined as $$\Sigma_i \langle I_z^i(t)\rangle - \langle I_z^i(0)\rangle$$

meaning as a sum of the differences between the expected values of the z-components of the spin operators of the nuclear spin moments 10 at the start and end of the sequence S.

The simulated dynamics during a radiofrequency pulse are described as $$U_{\theta,\pm X/\pm Y} = \exp\left[-i\frac{\theta}{\Omega_0}\left(\Delta S_z \pm \Omega S_{X/Y} + \sum_j \omega_I I_z^j + S_z(A_x^j I_x^j + A_z^j I_z^j)\right)\right]$$

in a frame of reference rotating with the frequency ω, where $U_{\theta,\pm X/\pm Y}$ describes the effect of a pulse $P^{\pm X/\pm Y}{}_\theta$, i.e., of a rotation through the angle θ along a pulse axis ±X or ±Y. $A_x^i$ and $A_z^i$ describe the perpendicular and parallel components of the interaction (in MHz) between the electron spin moment 16 (spin operator $S_z$) and the j-th nuclear spin moment 10 (I). For the illustrated simulations, a Larmor frequency $\omega_I = 2$ MHz for the nuclear spin moments 10 and $\Omega_0 = 50$ MHz for the error-free pulse amplitude are used as simulation parameters.

The simulation illustrated in FIG. 9a shows the result for the sequence S of FIG. 8 with rectangular pulses $P^{-X}{}_{90°}$, $P^{Y}{}_{180°}$, $P^{Y}{}_{90°}$, $P^{X}{}_{180°}$ for the system of five nuclear spin moments 10 and the electron spin moment 16. The simulation in FIG. 9b shows the result of the sequence S of FIG. 8 for the same system, in which the radiofrequency pulses are implemented as composite pulses with symmetric phases, which are described by the evolutions $$U_{90°,\pm X/\pm Y} = U_{-16°,\pm X/\pm Y} U_{300°,\pm X/\pm Y} U_{-266°,\pm X/\pm Y}$$
$$U_{54°,\pm X/\pm Y} U_{-266°,\pm X/\pm Y} U_{300°,\pm X/\pm Y} U_{-16°,\pm X/\pm Y}$$

and $$U_{180°,\pm X/\pm Y} = U_{325°,\pm X/\pm Y} U_{-263°,\pm X/\pm Y} U_{54°,\pm X/\pm Y}$$
$$U_{-266°,\pm X/\pm Y} U_{300°,\pm X/\pm Y} U_{-16°,\pm X/\pm Y}.$$

On account of the longer pulse durations of the composite pulses, the duration of time between the composite pulses has been increased to $5\tau/4 = 10\pi/8\omega_{Larmor}$ for the sequence S simulated in FIG. 9b.

The invention is not restricted to the exemplary embodiments described above. Rather, other variants of the invention can also be derived therefrom by a person skilled in the art without departing from the subject matter of the invention. In particular, all individual features described in conjunction with the exemplary embodiments are further also combinable with one another in different ways, without departing from the subject matter of the invention.

What is essential is that the sequence S manipulates the electron spin moment 16 in such a way that a polarization transfer from the electron spin moment 16 to an interacting nuclear spin moment 10 is facilitated. As a result, the polarization transfer is not implemented during a radiofrequency pulse $P_{ki}$, $P_{k'i}$ but during the durations of time $\tau_{ki}$, $\tau_{k'i}$ between the radiofrequency pulses $P_{ki}$, $P_{k'i}$ on account of the sum of the individual spin dynamics, in particular. As a result, a polarization transfer independent of the Hartmann-Hahn condition is facilitated. This consequently is advantageously taken across to the flexibility; in particular, this reduces the technical requirements in relation to the stability and quality of the radiofrequency generator 26.

In a conceivable alternative form, the first nuclear spin moments 10 and electron spin moments 16 are part of a common molecular structure of a molecule or a common lattice structure of a solid as a material sample 4. Here, the material sample 4 can also be a biological or medical sample, such as, e.g., a cell. An embodiment is likewise conceivable in which the electron spin moment 16 is part of a free monoradical or biradical molecule or of a metallic ion or a photoexcitable triplet state molecule. What is essential is that the electron spin moment 16 is brought into interaction with the nuclear spin moments 10. In suitable fashion, the electron spin moment 16 is optically polarizable.

In a further alternative configuration, it is possible, for example, for one or more radiofrequency pulses to act on the nuclear spin moments 10 in addition to the sequence S acting on the electron spin moments 16, the radiofrequency pulses acting on the nuclear spin moments having a frequency that is resonant with the Larmor frequency $\omega_{Larmor}$ of the nuclear spin moments 10 in the magnetic field B.

LIST OF REFERENCE SIGNS

2 Apparatus
4 Material sample
6 Magnet
6a North pole
6b South pole
8 Sample container
10 Spin moment/nuclear spin moment
12 Solid sample/nanoparticle/nanodiamond
14 Color center
16 Spin moment/electron spin moment
18 Laser light
20 Laser
22 Excitation coil
24 Pickup coil
26 Radiofrequency generator
28 Receiver
30 Display device
32 NMR spectrum
B Magnetic field
S Sequence/polarization sequence
D NMR signal
$M_z$ Equilibrium magnetization
$M_{z'}$ Magnetization
$M_{xy}$ Transversal magnetization
W Interaction
$H_{eff}$ Hamiltonian
$A_x$ Interaction strength
$\pi$ Pi
$\omega$ Frequency
$\omega_{Larmor}$, $\omega e$, $\omega_l$ Larmor frequency
$I_x$, $I_y$, $I_+$, $I_-$ Spin operator
$S_x$, $S_y$, $S_z$, $S_+$, $S_-$ Spin operator
$S_k$, $S_{k'}$ Sequence portion
$S_1$, $S_2$, $S_3$, $S_4$, $S_5$, $S_6$ Sequence portion
$P_{inter}$ Intermediate pulse
$P_{ki}$, $P_{k'i}$ Radiofrequency pulse
$P^X_{90}°$, $P^Y_{90}°$, $P^X_{180}°$, $P^Y_{180}°$, $P^{1/\sqrt{2}(X+Y)}_{180}°$ Radiofrequency pulse
$\tau^{pulse}_{ki}$, $\tau^{pulse}_{k'i}$ Pulse duration
$\tau_{ki}$, $\tau_{k'i}$, $\tau$ Durations of time
$E_{kj}$, $E_{k'j}$ Sequence unit
$T_{kj}$, $T_{k'j}$, Sequence unit duration
T Overall sequence duration
$\Delta\tau$ Time shift
$n_k$, $n_{k'}$ Pulse number
$P_{init}$ Initialization pulse
$P_{end}$ End pulse
$P^{YZ}_{180}°$ Composite pulse
X, Y, $1/\sqrt{2}$ (X+Y) Pulse axis
$U_{\theta, \pm X/\pm Y}$ Operator
$\delta\Omega$ Pulse error
$\Omega$, $\Omega_0$ Pulse amplitude
$\Delta$ Detuning
PT Polarization transfer

The invention claimed is:

1. A method for hyperpolarizing a material sample, which has a number of first spin moments of a first spin moment species,
   wherein the material sample is a solid,
   wherein the number of first spin moments is made to interact with a second spin moment of a second spin moment species,
   wherein the first spin moments are nuclear spin moments and the second spin moment is an electron spin moment,
   wherein the first and second spin moments are exposed to a homogeneous magnetic field,
   wherein the second spin moment is polarized along the magnetic field, and
   wherein the second spin moment is coherently manipulated by means of a sequence with a number of successive radiofrequency pulses, time-shifted from one another by durations of time, in such a way that there is a polarization transfer from the second spin moment to the first spin moments.

2. The method as claimed in claim 1, wherein a sequence is produced to manipulate the second spin moment, the overall sequence duration of which, composed of the individual durations of time between the radiofrequency pulses, for bringing about the polarization transfer is shorter than the duration of time inversely proportional to the strength of an interaction between the spin moments.

3. The method as claimed in claim 1, wherein only a flip angle of 90° and/or 180° is used for each radiofrequency pulse of the sequence.

4. The method as claimed in claim 1, wherein the radiofrequency pulses are produced along two pulse axes that are oriented perpendicular to one another.

5. The method as claimed in claim 1, wherein a radiofrequency pulse of the sequence is a composite pulse.

6. The method as claimed in claim 1, wherein a sequence portion is produced during the sequence, during which sequence portion four radiofrequency pulses, each with a 90° flip angle, follow one another with a shift in relation to one another with the same durations of time.

7. The method as claimed in claim 1, wherein a sequence portion is produced during the sequence, during which sequence portion a number of radiofrequency pulses, each with a 180° flip angle, follow one another with a shift in relation to one another with the same durations of time, wherein the radiofrequency pulses are alternately embodied as composite pulses.

8. The method as claimed in claim 1, wherein a first sequence portion and a radiofrequency pulse with a 90° flip angle and a second sequence portion are produced successively during the sequence, wherein, during the sequence portions, a number of radiofrequency pulses, each with a 180° flip angle, follow one another with a shift in relation to one another with the same durations of time in each case, and wherein the durations of time of the second sequence portion have a relative time shift in relation to the durations of time of the first sequence portion.

9. The method as claimed in claim 1 wherein a first sequence portion and a second sequence portion are produced immediately successively during the sequence, wherein the sequence portions each comprise two radiofrequency pulses with a 90° flip angle, a radiofrequency pulse with a 180° flip angle being arranged at the midpoint therebetween in each case, wherein, in the first sequence portion, the radiofrequency pulses with a 90° flip angle are produced along a first pulse axis and the radiofrequency pulse with a 180° flip angle is produced along a second pulse axis that is oriented perpendicular to the first pulse axis and wherein, in the second sequence portion, the radiofrequency pulses with a 90° flip angle are produced along the second pulse axis and the radiofrequency pulse with a 180° flip angle is produced along the negative first pulse axis.

10. A method for hyperpolarizing a material sample, which has a number of first spin moments of a first spin moment species,
   wherein the number of first spin moments is made to interact with a second spin moment of a second spin moment species,
   wherein the first spin moments are nuclear spin moments and the second spin moment is an electron spin moment,
   wherein the first and second spin moments are exposed to a homogeneous magnetic field,
   wherein the second spin moment is polarized along the magnetic field,
   wherein the second spin moment is coherently manipulated by means of a sequence with a number of successive radiofrequency pulses, time-shifted from one another by durations of time, in such a way that there is a polarization transfer from the second spin moment to the first spin moments,
   wherein a sequence portion is produced during the sequence, said sequence portion comprising at least one sequence unit,
   wherein the sequence unit has a sequence unit duration which is an odd multiple of half a Larmor period of the first spin moments in the magnetic field, and/or in that the radiofrequency pulses of successive sequence units have a relative time shift in relation to one another, and
   wherein one or more radiofrequency pulses are provided during a transition from a first sequence unit to a subsequent second sequence unit, said one or more radiofrequency pulses being used to rotate an alignment of the second spin moment that is oriented parallel to the magnetic field into a plane that is oriented perpendicular to the magnetic field.

11. An apparatus for hyperpolarizing a material sample before and/or during a magnetic resonance analysis according to the method as claimed in claim 1.

12. The method of claim 1, wherein the second spin moment is part of a free monoradical or biradical molecule.

13. The method of claim 1, wherein the pulse duration of the radiofrequency pulses is substantially shorter than the polarization transfer duration.

14. A method of solid-state NMR analysis, wherein a solid material sample is hyperpolarized according to the method of claim 1.

15. A method for hyperpolarizing a material sample, which has a number of first spin moments of a first spin moment species,
   wherein the number of first spin moments is made to interact with a second spin moment of a second spin moment species,
   wherein the first spin moments are nuclear spin moments and the second spin moment is an electron spin moment,
   wherein the first and second spin moments are exposed to a homogeneous magnetic field,
   wherein the second spin moment is polarized along the magnetic field,
   wherein the second spin moment is coherently manipulated by means of a sequence with a number of successive radiofrequency pulses, time-shifted from one another by durations of time, in such a way that there is a polarization transfer from the second spin moment to the first spin moments, and
   wherein the second spin moment is optically polarized for polarization along the magnetic field.

16. A method for hyperpolarizing a material sample, which has a number of first spin moments of a first spin moment species,
   wherein the number of first spin moments is made to interact with a second spin moment of a second spin moment species,
   wherein the first spin moments are nuclear spin moments and the second spin moment is an electron spin moment,
   wherein the first and second spin moments are exposed to a homogeneous magnetic field,
   wherein the second spin moment is polarized along the magnetic field,
   wherein the second spin moment is coherently manipulated by means of a sequence with a number of successive radiofrequency pulses, time-shifted from one another by durations of time, in such a way that there is a polarization transfer from the second spin moment to the first spin moments, and
   wherein an electron spin moment of a color center of a solid sample is used as a second spin moment.

17. The method as claimed in claim 10, characterized in that the sequence portion or portions are repeated multiple times in succession during the sequence.

* * * * *